United States Patent [19]

Solie

[11] Patent Number: 4,749,971
[45] Date of Patent: Jun. 7, 1988

[54] SAW DELAY LINE WITH MULTIPLE REFLECTIVE TAPS

[75] Inventor: Leland P. Solie, Mahomet, Ill.

[73] Assignee: Unisys Corporation, Blue Bell, Pa.

[21] Appl. No.: 65,747

[22] Filed: Jun. 24, 1987

[51] Int. Cl.⁴ .................. H03H 9/42; H03H 9/142
[52] U.S. Cl. ............................ 333/153; 333/150; 333/154
[58] Field of Search .................... 333/150–155, 333/142, 193–196; 310/313 R, 313 A, 313 B, 313 C, 313 D; 364/821

[56] References Cited

U.S. PATENT DOCUMENTS

| | | | |
|---|---|---|---|
| 3,568,102 | 3/1971 | Tseng | 333/153 |
| 3,753,164 | 8/1973 | DeVries | 333/153 |
| 3,883,831 | 5/1975 | Williamson et al. | 310/313 D X |
| 3,975,697 | 8/1976 | Paige | 310/313 D X |
| 4,166,228 | 8/1979 | Solie | 310/313 D |
| 4,477,784 | 10/1984 | Maerfeld e al. | 333/154 |
| 4,521,751 | 6/1985 | Riha et al. | 333/151 |
| 4,635,008 | 1/1987 | Solie | 333/195 |

Primary Examiner—Marvin L. Nussbaum
Attorney, Agent, or Firm—Glenn W. Bowen; Laurence J. Marhoefer

[57] ABSTRACT

A delay line with multiple taps is provided in which a hyperbolically tapered input transducer directs a wave to a plurality of hyperbolically tapered partial reflectors. A plurality of hyperbolically tapered output transducer taps are aligned with each of the partial reflectors so that varying delays may be obtained over a wide frequency band.

4 Claims, 3 Drawing Sheets

SAW DELAY LINE WITH MULTIPLE REFLECTIVE TAPS

BACKGROUND OF THE INVENTION

Surface acoustic wave (SAW) delay lines are employed for a number of signal processing applications. Frequency synthesizers, in particular, are one type of device which requires a tap delay line that can provide a wide range of delays, some of which may be relatively long. A SAW tap delay line may be used to advantage in such a device.

Prior wideband tapped SAW delay lines were constructed by using an input transducer which is in line with a number of separate output transducer taps along a single acoustic path. The output taps were lightly coupled in order to reduce losses due to reflections. Even with light coupling, reflections are a serious problem with such a device, particularly if there are a relatively large number of taps because the reflection of each tap may be directed straight into its neighboring taps.

Another disadvantage or limitation of such a prior type of SAW tap delay line is that the maximum delay path is limited by the length of the substrate. Since the piezoelectric materials generally employed for SAW devices may currently be manufactured only on relatively small wafers, the maximum delay can be substantially limited. For example, a maximally large size wafer of lithiumniopate (LiNbO$_2$) is three inches in diameter. With this size wafer, a maximum delay on the order of 18 microseconds is provided.

In order to get around this length limitation, there have been folded path geometries which used multiple-strip, coupled track changers, so that the acoustic waves are reflected from one path into another path after the first path has been substantially traversed. The performance of this type of device, however, is substantially limited by excessive loss due to spurious reflections.

The SAW delay line with multiple reflective taps of the present invention provides an improved structure with longer delays and lower losses.

BRIEF DESCRIPTION OF THE DRAWING

The present invention is illustrated by reference to the drawing in which.

TECHNICAL DESCRIPTION OF THE INVENTION

Figure 1:
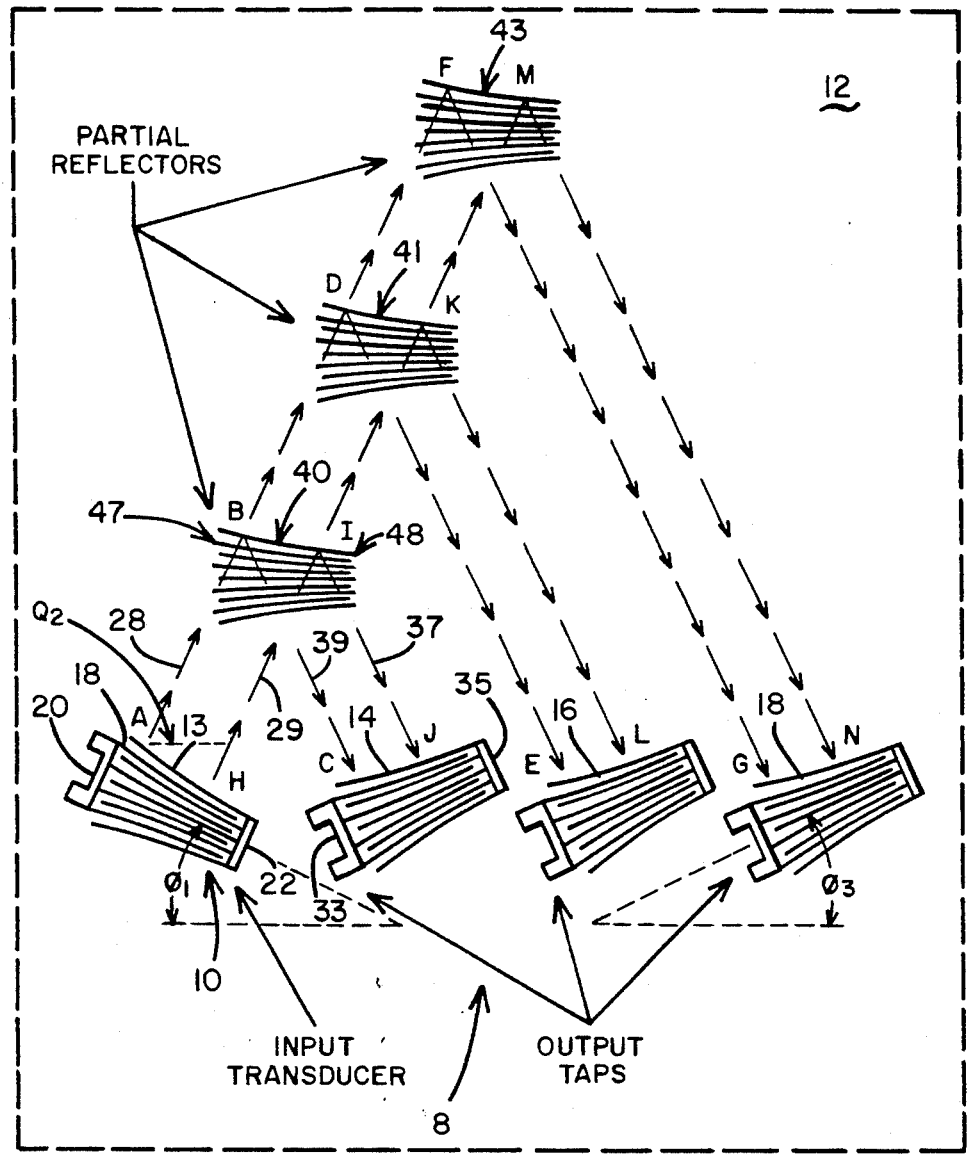
FIG. 1 shows a top view of a SAW delay line with multiple reflective taps, which is constructed in accordance with the present invention.

Referring to FIG. 1, there is shown a delay line 8 which employs an input transducer 10 and a plurality of output transducers 14, 16 and 18. These transducers are of the type shown in U.S. Pat. No. 4,635,008 issued Jan. 6, 1987, in the name of the inventor of the present applicant and assigned to the assignee of the present application, Unisys Corporation which is the successor to Sperry Corporation. The transducers are constructed with hyperbolically tapered interdigital electrode fingers on the surface of the piezoelectric wafer 12. As shown in FIG. 1, the distance between the fingers 13, which are attached to the short electrode 22, and the fingers 18, which are attached to the long electrode 20, are spaced closer together as they approach this short electrode and are spaced farther apart toward the long electrode. Thus, when the input transducer 10 is driven lower frequency waves will be launched near the long electrode 20, such as the wave along the line 28, while relatively higher frequency waves will be launched toward the short electrode 22, such as a wave along the line 29.

The output transducers 14, 16 and 18 are constructed in the same manner as the input transducer 10. Their orientation is reversed, however, so that instead of having the short electrode disposed to the right and lower than the longer electrode, the longer electrode 33 of the transducer 14, for example, is disposed below and to the left of the shorter electrode 35 in FIG. 1. In this manner, incoming waves with a higher frequency are directed along the line 37 are preferentially detected by the portion of the transducer 14 where the fingers are spaced closer together, while lower wave components directed along the line 39 are preferentially detected by the portion of the transducer 14 where the fingers are spaced further apart.

The partial reflectors 40, 41 and 43 consist of hyperbolically tapered fingers similar to those of the input and output transducers, but there are no transversed short and long electrodes, such as the electrodes 20, 22 of the input transducer associated with the reflectors. Instead the fingers of these reflectors are left "floating" on the substrate 12. (Grooves in the substrate may be substituted for the preferred deposited electrodes of the reflectors.) In the illustrated embodiment of FIG. 1, the wider spaced portion of the reflectors, such as the portion 47, are disposed toward the left in the figure to correspond with the wider section of the input transducer 12, while the narrower section 48 of the reflectors, which correspond to the higher frequency portion of the input transducer 12, are disposed to the right. The low frequency wave along the line 28 will, therefore, travel from point A to point B, and a portion of it will be reflected along the line 38 to the high frequency receiving end of the output transducer 14, or first tap of the delay line at the point C. The remaining portion of the wave will travel across the surface to a second reflector 41, where part of it will be reflected at the point D to the low frequency point E of the output transducer 16 or second tap. Correspondingly, the remaining portion of the wave will travel to the point F on the reflector 43 where part of it will be reflected to the point G of the output transducer 18, or third tap.

In a corresponding manner, the high frequency signal from the point H will travel along the line 29 to the first reflection point I on the first reflector 48, where a portion of it will be reflected back to the point J of the first output tap. The remaining portion of the wave will then travel to the point K, where part of it will be reflected to the point L of the second output tap, and the remaining portion will go to the point M, where a part of it will be reflected to the point N of the third output tap.

It is thus seen that the reflectors 40, 41 and 43 of the figure are placed in alignment with the input transducer 10 and the output transducers 14, 16 and 18, so that a wave of a particular frequency travelling along a particular line from the input transducer, such as the line 28, will encounter the same inter-electrode spacing at the reflectors 40, 41 and 43, and the output taps, as it did at its launching point on the input transducer 10. In other words, the electrodes of the output transducers 14, 16 and 18 are matched point-for-point with the input transducer 10. Thus, points A, B, C, D, E, F and G have identical interelectrode spacings as do points H, I, J, K, L, M and N.

In FIG. 1 the displacement of the input transducer from the horizontal by angle 1 results in a matching displacement of the partial reflectors so the waves travel in the direction defined by the angle 2 after leaving the input transducer. As shown in FIG. 1, each of the partial reflectors are displaced from the succeeding one further to the right as the delay time increases, going from the shortest delay reflector 40 to the longest delay reflector 43. Correspondingly, the output taps 14, 16 and 18 are disposed from the horizontal by the angle 3, as is required to maintain the matched electrode spacing of the output taps. The angle 1 is preferably in the range of 30 to 60 degrees, and the angles 2 and 3 are correspondingly determined in accordance with the foregoing principles.

Construction of the multiple delay line of the preferred embodiment utilizes a path link which is folded so that there is essentially double the maximum achievable gain that can be achieved with an in-line series arrangement as previously known. Furthermore, this design suppresses spurious reflections from the output taps. The electrode fingers of the transducers and reflectors of the present invention preferably have hyperbolically tapered electrode fingers so there is a linear relationship between the frequency launched by the input transducer and received by the output transducers, which is correlated with the location of the launched or received wave. If nontapered transducer and reflector electrodes were substituted for the hyperbolically tapered ones, the bandwidth of the reflectors would be limited to the center frequency of the input transducer divided by the number of reflecting electrodes in a reflector. Thus, if a 100 electrodes, or grooves, were necessary to achieve adequate reflectivity, the bandwidth would only be 1% for such a device. This contrasts with the hyperbolically tapered reflectors of the preferred embodiment disclosed, wherein a 100 electrodes could be employed in the reflectors without any substantial loss of bandwidth.

By using hyperbolically tapered fingers for the input transducer 10, the partial reflectors 40, 41 and 43 and the output transducers 14, 16, and 18, a delay line is provided that has a smooth and flat bandwidth. The SAW device of FIG. 1 also has a substantially lower spurious reflection signal than prior art devices. In order for a reflection from an output tap to reach another output tap, and thus generate the spurious signals, the wave must be reflected from the output tap to a reflector and back to the input transducer, and then it must again be reflected by the input transducer to one of the tapered reflectors and back to the output transducer. Since this path involves multiple paths, the spurious signal level will be substantially reduced, on the order of 60 dB, below the desired signal.

Hyperbolically tapered transducers are preferred for use in the delay line of the present invention and, as described above, since conventional, parallel straight line transducer fingers will not provide a wideband response. The delay line may be implemented, however, with transducers and reflectors which have curved fingers which are not hyperbolically tapered, but which may approximate a flatter frequency response than can be obtained with conventional configurations. An example of the construction of a transducer with curved fingers is shown in the article entitled "Improved Modeling of Wideband Linear Phase SAW Filters Using Transducers with Curved Fingers" by N. J. Slater and C. K. Campbell, which was published in IEEE Transactions on Sonics and Ultrasonics, Vol. SU-31, No. 1, January 1984, pages 46–50. If such a configuration is substituted for the hyperbolically tapered fingers of the elements of the preferred embodiment, however, there will be some compromise in bandwidth.

A transducer with straight-slanted fingers is described in the article "Wideband Linear SAW Filters Using Apodized Slanted Finger Transducers" by P. M. Naraine and C. K. Campbell in IEEE Ultrasonics Symposium Proceedings, 1983, pages 113–116. The slanted finger to digital transducer structure described in this article employed straight-slanted fingers which emanated from a common focal point in an effort to yield flat amplitude response across a passband. Apodizaton of the device was derived from a computer optimization routine to compensate for the inherent negative amplitude slope of an unapodized slanted finger transducer so that external amplitude equalization circuits were not needed. In this configuration, however, an even greater sacrifice of bandwidth will occur, although the construction of the transducer is somewhat simpler.

Figure 2:
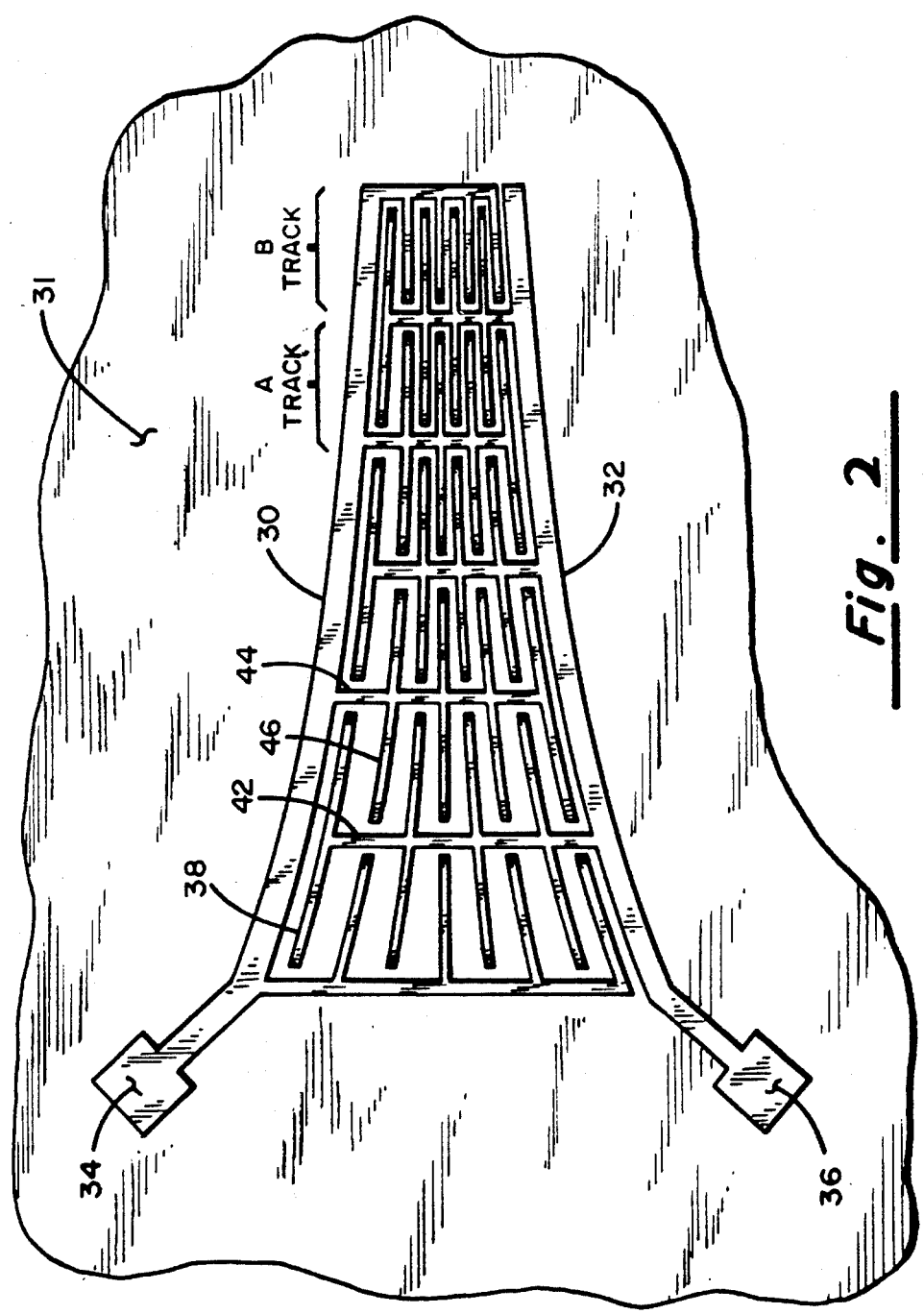
FIG. 2 shows an alternative version of the transducers of FIG. 1.

FIG. 2 shows a modification of the transducers with hyperbolic shaped electrode fingers of FIG. 1 which may be utilized when it is necessary to further reduce the insertion loss for such transducers. This modification involves the segmenting of the fingers of the transducer so that only the two outer, widened electrode fingers 30 and 32, (on a suitable substrate 31, such as a piezoelectric acoustic-wave-propagating medium, or other substrate known to be suitable for the purpose) connect to the opposite electrode pads 34 and 36 respectively, and extend along the entire length of the transducer. The remaining inner electrodes, such as the electrodes 38 and 46, extend along only a portion of the outer fingers 30 and 32, and are connected to their respective outer fingers through crossbeams, such as the crossbeams 42, 44. By segmenting the inner electrode segments, and by increasing the width of the outer electrodes 30 and 32, a decrease in electrode resistance is obtained which allows the width of the inner electrodes to be sufficiently narrow to produce a transducer which does not have substantially different acoustic impedance than the transducer of FIG. 1. The electrical parasitic resistance, however, is approximately decreased by $N^2$ over this transducer, where N is the number of segments, such as the electrode 38 into which each finger electrode is divided. For example, in the embodiment shown in FIG. 3 where there are six segments, the electrode resistance will be approximately 1/36 of the resistance of the transducer shown in FIG. 1.

Figure 3:
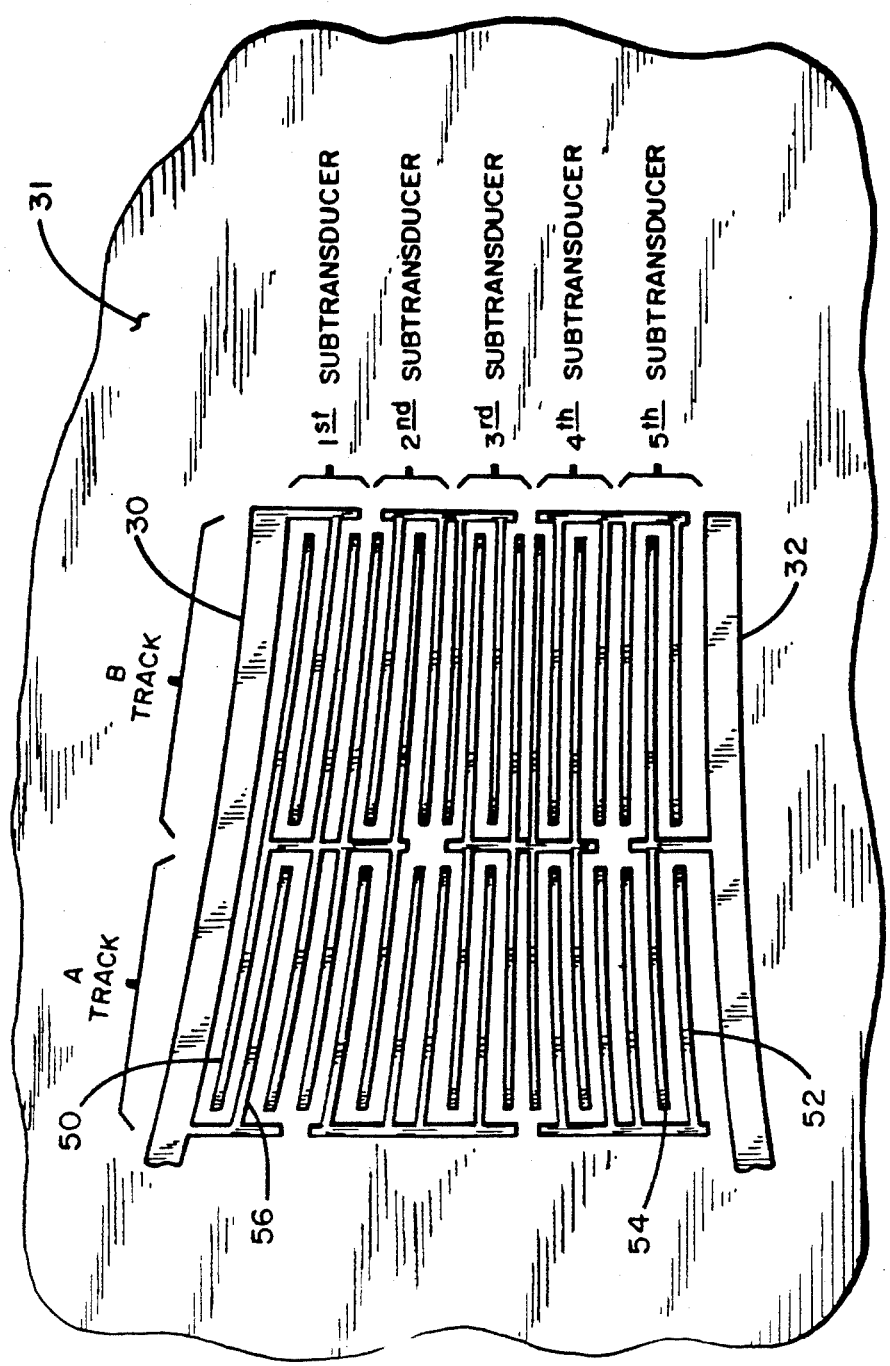
FIG. 3 shows another alternate version of the transducers of FIG. 1.

FIG. 3 shows another modification in which each segment of the transducer may be subdivided to provide a number of subtransducers across the outer electrodes. The showing of FIG. 3, for simplification, illustrates only two tracks of the transducer, which correspond to the tracks between the lines A and B of FIG. 2. Interconnections in these tracks provide a number of capacitively coupled, floating electrode subtransducers. For example, in FIG. 3 there are five subtransducers in each track which are connected in series to provide a voltage dividing path between the electrodes 30, 32. For example, capacitive coupling occurs between sections 30 and 50, 32 and 52, 52 and 54, 50 and 56, etc., of FIG. 3. By using the electrodes of the transducer of FIG. 3, the acoustic impedance is increased by factor $N^2$, where N is the number of subtransducers of each track, over the acoustic impedance of the transducer of FIG. 2. Thus, in the illustrated embodiment of FIG. 3, the acoustic impedance is increased by a factor of 25, as compared to a transducer with the same number of electrodes but with only one subtransducer per segment as in FIG. 2.

What is claimed is:

1. A surface acoustical wave (SAW) delay line comprising
   an input transducer,
   a plurality of reflector means, and
   a plurality of output transducers,
   wherein said transducers are formed of interdigital elongated electrode fingers positioned such that the spacing between said fingers varies from point-to-point along said transducers and the spacing between said fingers is substantially constant at any point, and said reflector means are each formed of elongated reflective elements which are spaced from each other by a distance which varies along said reflective means so as to match the variation in spacing that exists between said fingers of said transducers, wherein said transducers and reflective means are all located and aligned so that spacing between said electrode fingers at the launching point of a SAW of a predetermined frequency from said input transducer, the spacing between reflective elements at each reflection point of each reflection means that said SAW contacts and the spacing between electrode fingers of said output transducers at the reception point of said SAW at any of said output transducers which receives said SAW of said predetermined frequency are all substantially equal.

2. A SAW delay line as claimed in claim 1 wherein said electrode fingers of said transducers are each formed as segments of hyperbolic curves.

3. A SAW delay line as claimed in claim 2 wherein said curved electrode fingers comprise a pair of outer electrode fingers and a plurality of inner electrode fingers, said outer electrode fingers are relatively wider than said inner electrode fingers, said inner electrode fingers are subdivided into a plurality of hyperbolic curved sections, and said transducer comprises interconnection electrode connection means for connecting each of said sections to one of said outer electrode fingers.

4. A SAW delay line as claimed in claim 3 wherein said transducer is divided into a plurality of tracks, and each of said tracks is subdivided into a plurality of subtransducer elements which comprise floating electrode fingers which are not connected to either of said outer electrode fingers but which are configurated so they capacitively couple subtransducers that are a given track in electrical series.

* * * * *

UNITED STATES PATENT AND TRADEMARK OFFICE
CERTIFICATE OF CORRECTION

PATENT NO. : 4,749,971
DATED : June 7, 1988
INVENTOR(S) : Leland P. Solie

It is certified that error appears in the above-identified patent and that said Letters Patent are hereby corrected as shown below:

Column 3
  Line 7, before "1" insert -- $\phi$ -- .

Line 9, before "2" insert -- $\phi$ -- .

Line 16, before "3" insert -- $\phi$ -- .

Line 17, before "1" insert -- $\phi$ -- .

Line 18, before "2" and "3" insert -- $\phi$ -- .

Signed and Sealed this

Fifteenth Day of November, 1988

Attest:

DONALD J. QUIGG

*Attesting Officer*      *Commissioner of Patents and Trademarks*